(12) United States Patent
Jeon

(10) Patent No.: US 9,076,917 B2
(45) Date of Patent: Jul. 7, 2015

(54) METHOD OF MANUFACTURING PHOTOVOLTAIC CELL

(71) Applicant: INDUSTRY-ACADEMIC COOPERATION FOUNDATION, YEUNGNAM UNIVERSITY, Gyeongsan-si (KR)

(72) Inventor: Chan-Wook Jeon, Seoul (KR)

(73) Assignee: INDUSTRY-ACADEMIC COOPERATION FOUNDATION, YEUNGNAM UNIVERSITY, Gyeongsan (KR)

( * ) Notice: Subject to any disclaimer, the term of this patent is extended or adjusted under 35 U.S.C. 154(b) by 117 days.

(21) Appl. No.: 13/776,404

(22) Filed: Feb. 25, 2013

(65) Prior Publication Data
US 2013/0224902 A1    Aug. 29, 2013

(30) Foreign Application Priority Data

Feb. 24, 2012    (KR) ................ 10-2012-0019370
Feb. 24, 2012    (KR) ................ 10-2012-0019371

(51) Int. Cl.
| | |
|---|---|
| H01L 31/18 | (2006.01) |
| H01L 31/032 | (2006.01) |
| H01L 31/0749 | (2012.01) |
| C23C 14/24 | (2006.01) |
| C23C 14/28 | (2006.01) |
| C23C 14/58 | (2006.01) |
| H01L 21/02 | (2006.01) |

(52) U.S. Cl.
CPC ........... *H01L 31/18* (2013.01); *H01L 21/02568* (2013.01); *H01L 31/0322* (2013.01); *H01L 31/0749* (2013.01); *C23C 14/243* (2013.01); *C23C 14/28* (2013.01); *C23C 14/5866* (2013.01); *H01L 21/02614* (2013.01); *Y02E 10/541* (2013.01)

(58) Field of Classification Search
USPC ........................................... 438/95
See application file for complete search history.

(56) References Cited

U.S. PATENT DOCUMENTS 3,833,421 A * 9/1974 Rubischko et al. ........... 429/103
6,444,043 B1    9/2002 Gegenwart et al.
(Continued)

FOREIGN PATENT DOCUMENTS

| JP | 11-147800 A | 6/1999 |
|---|---|---|
| JP | 2000-203989 A | 7/2000 |

(Continued)

*Primary Examiner* — Charles Garber
*Assistant Examiner* — Stanetta Isaac

(57) ABSTRACT

Provided is a method for manufacturing a photovoltaic cell in which a light absorption layer is formed by promoting chalcogenation. The method includes providing a microporous member, arranging an object on a first side of the microporous member, and arranging a chalcogen source on a second side of the microporous member opposite to the first side, heating the chalcogen source, transmitting a liquefied or evaporated portion of the heated chalcogen source through the microporous member, and exposing the object to the liquefied or evaporated portion of the heated chalcogen source that has passed through the microporous member.

13 Claims, 11 Drawing Sheets

(56) References Cited

U.S. PATENT DOCUMENTS

| | | | |
|---|---|---|---|
| 8,601,611 B2 * | 12/2013 | Gogotsi et al. | 850/60 |
| 2006/0254505 A1 | 11/2006 | Tsvetkov et al. | |
| 2009/0158994 A1 | 6/2009 | Miyanaga et al. | |
| 2009/0308454 A1 | 12/2009 | Korevaar et al. | |
| 2010/0203263 A1 | 8/2010 | Czubatyj | |
| 2012/0040516 A1 * | 2/2012 | Xia | 438/478 |
| 2012/0060928 A1 * | 3/2012 | Johnson et al. | 136/264 |

FOREIGN PATENT DOCUMENTS

| | | |
|---|---|---|
| JP | 2003-238299 A | 8/2003 |
| JP | 2011-178590 A | 9/2011 |
| JP | 2011-243617 A | 12/2011 |

* cited by examiner

METHOD OF MANUFACTURING PHOTOVOLTAIC CELL

CROSS-REFERENCE TO RELATED PATENT APPLICATIONS

This application claims the benefit of Korean Patent Applications No. 10-2012-0019370, filed on Feb. 24, 2012, and 10-2012-0019371, filed on Feb. 24, 2012, in the Korean Intellectual Property Office, the disclosure of which is incorporated herein in its entirety by reference.

BACKGROUND OF THE INVENTION

1. Field of the Invention

Embodiments of the present invention relate to a photovoltaic cell, and in particular, to an apparatus for manufacturing a photovoltaic cell including a chalcogen material and a method for manufacturing a photovoltaic cell including a chalcogen material.

2. Description of the Related Art

Development of alternative energy resources, in particular, solar energy resources, is actively carried out to stave off depletion of petroleum resources. The development of solar energy resources is mainly performed by solar light power generation obtained by converting solar energy into electric energy, and is focused on the development of highly efficient photovoltaic cells.

Photovoltaic cells have a p-n junction in which a p-type semiconductor layer contacts an n-type semiconductor layer. Solar light reaches the p-n contact to generate photoelectromotive force, and thus, electric energy is generated. Currently, silicon semiconductor-based photovoltaic cells, which are a first generation photovoltaic cell, are typically used. However, due to requirements regarding lightweight and thin structures, manufacturing costs, productivity, and production applicability, compound thin film photovoltaic cells, which are second generation photovoltaic cells, are being developed as an alternative.

A chalcopyrite-based compound semiconductor material, such as $CuInSe_2$, may be used as a material for use as a light absorption layer in a compound thin film photovoltaic cell. Such a chalcopyrite-based compound semiconductor material has a direct transition-type energy band gap and the highest photoabsorption coefficient of $1 \times 10^5$ cm$^{-1}$ from among semiconductors. A chalcopyrite-based compound semiconductor may enable manufacturing of high-efficient photovoltaic cells in the form of a thin film having a thickness of 1 μm to 2 μm, and may retain high electroptical stability for a long period of time.

$CuInSe_2$ has a band gap of 1.04 eV. Accordingly, to adjust the band gap to be an ideal band gap of 1.4 eV, a portion of indium (In) may be substituted with gallium (Ga), and a portion of selenium (Se) may be substituted with sulfur(S). For reference, $CuGaSe_2$ has a band gap of 1.6 eV, and $CuGaS_2$ has a band gap of 2.5 eV. A four-membered compound including copper-indium-gallium-selenium is referred to as CIGS, and a material including copper-indium-gallium-selenium-sulfur is referred to as CIGSS.

However, since CIGS and CIGSS are poly-membered compounds, it is difficult to form a light absorption layer by using such materials. In addition, since a selenization reaction used in the manufacturing process for a light absorption layer requires toxic and corrosive $H_2Se$ gas, the selenization needs to be performed with a great deal of caution. Manufacturing costs may be high due to the need for installation of a special waste processing apparatus. In addition, selenium is highly likely to form a high molecular weight gas when it forms a selenium layer by deposition or evaporation, and when selenium is exposed to a small temperature gradient in a chamber, it may quickly solidify with a heterogeneous structure. Thus, the formed light absorption layer may have a heterogeneous selenium concentration gradient, thereby leading to a decrease in chalcogenation and an increase in surface roughness. Such problems may result in a decrease in efficiency of a photovoltaic cell.

SUMMARY OF THE INVENTION

Embodiments of the present invention provide a method for manufacturing a photovoltaic cell in which a light absorption layer is formed by promoting chalcogenation.

According to an aspect of the present invention, a method of manufacturing a photovoltaic cell is provided, wherein the method includes providing a microporous member, arranging an object on a first side of the microporous member, and arranging a chalcogen source on a second side of the microporous member opposite to the first side, heating the chalcogen source, transmitting a liquefied or evaporated portion of the heated chalcogen source through the microporous member, and exposing the object to the liquefied or evaporated portion of the heated chalcogen source that has passed through the microporous member.

According to some embodiments of the present invention, the step of exposing the object to the liquefied or evaporated portion of the heated chalcogen source includes chalcogenizing the object.

According to some embodiments of the present invention, the chalcogen source may include selenium, sulfur, or a mixture thereof.

According to some embodiments of the present invention, the chalcogen source comprises a mixture of selenium and sulfur, and exposing the object to the liquefied or evaporated portion of the heated chalcogen source includes simultaneously selenizing and sulfurating the object.

According to some embodiments of the present invention, the method may further include forming an inert gas atmosphere with respect to the object and the chalcogen source before heating the chalcogen source.

According to some embodiments of the present invention, the method may further include forming a vacuum atmosphere with respect to the object and the chalcogen source before forming the inert gas atmosphere.

According to some embodiments of the present invention, the heating may be performed at a temperature of about 220° C. to about 680° C.

According to some embodiments of the present invention, the object may include at least one of copper, indium, and gallium.

According to some embodiments of the present invention, heating the chalcogen source includes providing more heat to an upper portion of a chamber enclosing the object and the chalcogen source than to a lower portion of the chamber.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
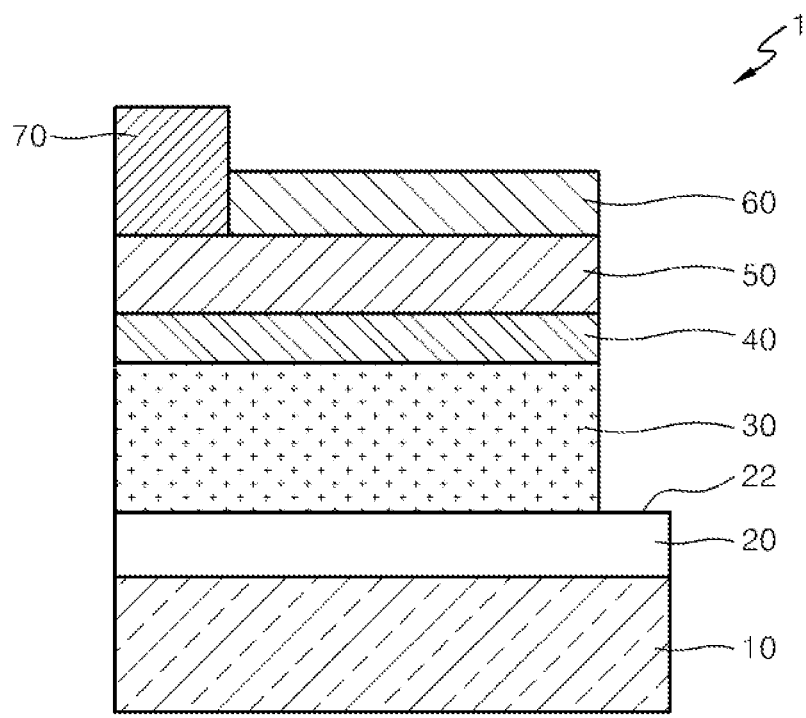
FIG. 1 is a cross-sectional view of a photovoltaic cell manufactured using an apparatus for manufacturing a photovoltaic cell according to an embodiment of the present invention.

Hereinafter, embodiments of the present invention will be described more fully with reference to the accompanying drawings. The invention may, however, be embodied in many different forms and should not be construed as being limited to the embodiments set forth herein; rather, these embodiments are provided so that this disclosure will be thorough and complete, and will fully convey concepts of the invention to those of ordinary skill in the art. As used herein, the term "and/or" includes any and all combinations of one or more of the associated listed items. Like reference numerals may denote like elements in different drawings. Furthermore, various elements and regions in drawings may be schematically illustrated. Accordingly, the scope of the present invention is not limited by relative sizes or gaps of elements illustrated in the drawings.

FIG. 1 is a cross-sectional view of a photovoltaic cell 1 manufactured by using an apparatus for manufacturing a photovoltaic cell according to an embodiment of the present invention.

Referring to FIG. 1, the photovoltaic cell 1 includes a lower electrode 20, a light absorption layer 30, a buffer layer 40, and an upper electrode 50, which are sequentially disposed in this stated order on a substrate 10. A grid electrode 70 may be disposed on a portion of the upper electrode 50. In addition, in some embodiments, a reflection preventing layer 60 may be disposed on the upper electrode 50.

In an embodiment, the lower electrode 20 may have a thickness of about 0.5 μm, the light absorption layer 30 may have a thickness of about 2 μm, the buffer layer 40 may have a thickness of about 0.05 μm, and the upper electrode 50 may have a thickness of about 0.5 μm. However, such thicknesses are only examples, and embodiments of the present invention are not limited thereto.

The substrate 10 may be a glass substrate, for example, a sodalime glass substrate. According to another embodiment, the substrate 10 may be a ceramic substrate formed of, for example, alumina, a metal substrate formed of, for example, stainless steel, or copper (Cu) tape, or a polymer substrate. In other embodiments, the substrate 10 may be formed of a flexible polymer material, such as polyimide, or a stainless thin film.

The lower electrode 20 may be disposed on the substrate 10. For the lower electrode 20 to be used as an electrode, the lower electrode 20 preferably has a low specific resistance. In order to prevent exfoliation of the lower electrode 20 from the substrate 10 due to a difference in the coefficients of thermal expansion of the respective materials, the lower electrode 20 preferably has excellent adhesion properties with respect to the substrate 10. The lower electrode 20 may be formed by, for example, sputtering. The lower electrode 20 may include nickel (Ni), copper (Cu), molybdenum (Mo), or an alloy thereof. Of these materials, molybdenum has particularly desirable characteristics, such as high electric conductivity, excellent ohmic contact characteristics with respect to the light absorption layer 30, and high-temperature stability in a selenium (Se) atmosphere process.

The light absorption layer 30 may be disposed on a portion of the lower electrode 20. An exposure region 22 of the lower electrode 20 on which the light absorption layer 30 is not disposed may provide an electric contact to an external device. The light absorption layer 30 may include a material that absorbs solar light and converts the solar light into an electric signal, and may include a p-type semiconductor material. The light absorption layer 30 may include, for example, at least one of copper (Cu), indium (In), and gallium (Ga). In addition, the light absorption layer 30 may further include a chalcogen-based material, for example, selenium (Se), sulfur (S), or a mixture thereof. In various embodiments, the light absorption layer 30 may include a 4-membered material of copper-indium-gallium-selenium (CIGS) or a 5-membered material of copper-indium-gallium-selenium-sulfur (CIGSS). An example of a method of manufacturing the light absorption layer 30 is described in detail below.

A buffer layer 40 may be disposed on the light absorption layer 30. The buffer layer 40 may reduce a difference in lattice constants of the light absorption layer 30 and the upper electrode 50 and a difference in an energy band gap of the light absorption layer 30 and the upper electrode 50, thereby providing an excellent p-n junction. According to another embodiment, the buffer layer 40 may be omitted. The buffer layer 40 may include an n-type semiconductor material, and a resistance thereof may be varied by doping with impurities. For example, a resistance of the buffer layer 40 may be reduced by doping with boron (B), indium (In), gallium (Ga), or aluminum (Al). The buffer layer 40 may include cadmium sulfide (CdS) or indium-selenium ($In_xSe_y$). When the buffer layer 40 includes cadmium sulfide (CdS), chemical bath deposition (CBD) may be used to form a cadmium sulfide (CdS) film. In another embodiment, when the buffer layer 40 includes indium-selenium, toxicity of CdS may be prevented and wetting for the formation of cadmium sulfide may be omitted.

The upper electrode 50 may have excellent electrical conductivity and high optical transmittance, and may be referred to as a transparent electrode. The upper electrode 50 may include at least one of a zinc oxide (ZnO) and an indium tin oxide (ITO). ZnO may have an energy band gap of about 3.3 eV and an optical transmittance of about 80% or more. In addition, the upper electrode 50 may have a low specific resistance of about $10^{-4}$ ohm-cm or lower by doping with an impurity element, such as aluminum (Al) or boron (B). For example, when the upper electrode 50 is doped with boron (B), optical transmittance of near infrared region may increase and thus, a short current may increase.

When the upper electrode 50 includes ZnO, the upper electrode 50 may be formed by RF sputtering using a ZnO target, reactive sputtering using a zinc target, or an organometallic chemical deposition. In addition, the upper electrode 50 may be formed of multiple layers including a plurality of deposited layers. For example, the upper electrode 50 may be formed as a multi-layer electrode in which an ITO thin film is formed on a ZnO thin film, or a multi-layer electrode in which an n-type ZnO thin film is formed on an intrinsic semiconductor-type ZnO thin film. The upper electrode 50 having such multi-layered structures may improve efficiency of the photovoltaic cell 1.

In an embodiment, the reflection preventing layer 60 may be disposed on the upper electrode 50. The reflection preventing layer 60 may reduce reflection loss of incident solar light. In addition, the reflection preventing layer 60 may reflect light that has passed into the solar cell and is reflected internally, that would otherwise escape back out of the photovoltaic cell 1. Accordingly, efficiency of the photovoltaic cell 1 may increase. For example, the reflection preventing layer 60 may increase efficiency of the photovoltaic cell by about 1%. The reflection preventing layer 60 may include, for example, magnesium fluoride ($MgF_2$), and may be formed by, for example, electron beam evaporation. Other embodiments do not include the reflection preventing layer 60.

The grid electrode 70 may be disposed on a portion of the upper electrode 50, and may be electrically connected to the upper electrode 50. The grid electrode 70 may collect a current, in a pair with the lower electrode 20, on the surface of the photovoltaic cell 1. The grid electrode 70 may include aluminum (Al), nickel (Ni), or an alloy thereof. The aluminum and/or nickel may be disposed in one or more layers to form the grid electrode 70. Since the grid electrode 70 forms a non-transparent region, solar light is not absorbed into the photovoltaic cell 1 therethrough. Accordingly, it is preferable to minimize the area occupied by the grid electrode 70.

Figure 2:
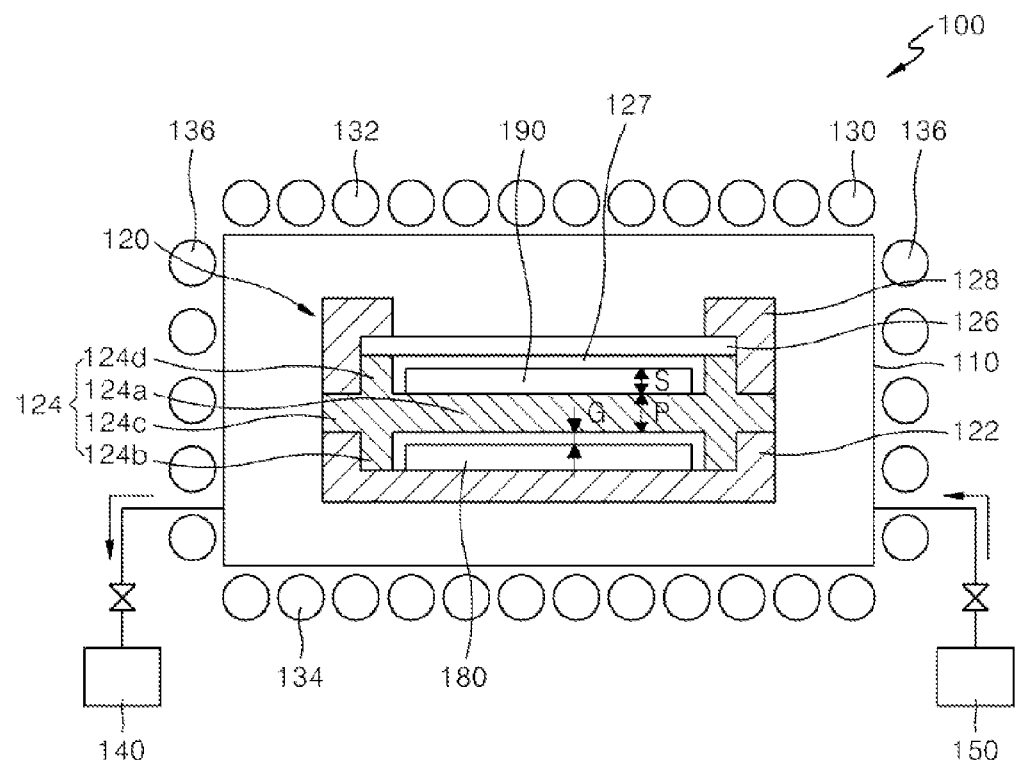
FIG. 2 is a cross-sectional view of an apparatus for manufacturing a photovoltaic cell according to an embodiment of the present invention.

FIG. 2 is a cross-sectional view of an apparatus 100 for manufacturing a photovoltaic cell, according to an embodiment of the present invention. Shapes of elements that constitute the apparatus of FIG. 2 are by way of example, and embodiments of the present invention are not limited thereto.

Referring to FIG. 2, the apparatus 100 may include a chamber 110, a layer formation unit 120, a heating unit 130, a vacuum formation unit 140, and a gas supplying unit 150.

The chamber 110 provides a space for the layer formation unit 120. The chamber 110 may be formed of metal such as aluminum or stainless steel, tempered glass, quartz, or graphite. When the chamber 110 is formed of a transparent material, such as temperature glass or quartz, rapid thermal annealing may be easily performed. The layer formation unit 120 may include an object supporting element 122, a microporous member 124, a window element 126, and a fixing element 128.

An object 180 may be mounted on the object supporting element 122, and the object supporting element 122 may support the object 180. In an embodiment, the object supporting element 122 comprises a susceptor including graphite coated with silicon carbide. The object supporting element 122 may deliver heat of the heating unit 130 to the object 180.

The object 180 is a structure in which required layers are to be formed by the apparatus 100. For example, the object 180 may correspond to the substrate 10 of FIG. 1, or a structure of various layers formed on the substrate. In an embodiment, the object 180 may be a structure in which at least one layer including at least one of copper, indium, and gallium is formed on the substrate. For example, the object 180 may be a multi-layer structure including a copper layer, an indium layer, and a gallium layer formed on a substrate. In this case, as seen in FIG. 1, a lower electrode 20 formed of, for example, molybdenum, may be disposed directly on a substrate 10. According to another embodiment, the object 180 may have a structure in which a copper-indium-gallium layer is disposed on a substrate.

The microporous member 124 may be disposed such that it covers the object 180. In addition, as seen in FIG. 2, the microporous member 124 may be spaced apart from the object 180 by a spacing gap G. A chalcogen source 190 may be mounted on the microporous member 124, and the microporous member 124 may support the chalcogen source 190. The microporous member 124 may include a material having a plurality of micropores therein, and for example, may include graphite. The vaporized chalcogen source 190 may pass through the microporous member 124 through the micropores. The chalcogen source 190 passing through the microporous member 124 may form a chalcogen layer on the object 180, or may react with a material included in the object 180. The microporous member 124 will be described in detail with reference to FIG. 3.

The microporous member 124 may include a microporous body element 124a, a first supporting element 124b, a second supporting element 124c, and a third supporting element 124d. The microporous body element 124a may be configured to allow the object 180 to be located thereunder, and to allow the chalcogen source 190 to be located thereabove. The microporous body element 124a may include micropores through which vaporized chalcogen material passes from the chalcogen source 190. The first supporting element 124b and the second supporting element 124c may support the microporous member 124 in such a way that the microporous member 124 is spaced apart from the object 180. The third supporting element 124d may provide a space for the chalcogen source 190. The third supporting element 124d may support the window element 126 in such a way that the microporous body element 124a is spaced apart from the window element 126.

In an embodiment, the microporous body element 124a, the first supporting element 124b, the second supporting element 124c, and the third supporting element 124d are formed to be a unified continuous single monolithic body structure, constituting the microporous member 124. In other words, in an embodiment, the microporous body element 124a may comprise a single continuous structure which does not include assembly of multiple parts.

According to another embodiment, the microporous body element 124a, the first supporting element 124b, the second supporting element 124c, and the third supporting element 124d may each be formed as separate structures, and then assembled together to form the microporous member 124. In such an embodiment, the microporous body element 124a may include graphite, and the first supporting element 124b, the second supporting element 124c, and the third supporting element 124d may include silicon carbide-coated graphite. Examples of the microporous member 124 are described in detail with reference to FIGS. 12 to 15.

The microporous body element 124a may be spaced from the object 180 by the spacing gap G. The spacing gap G may be in a range of, for example, about 0.5 mm to about 3 mm. In a specific embodiment, gap G is about 1 mm. As used herein, the term "about" with respect to specific values is intended to include values that are close to the stated values and ranges, but are not precisely the stated value or range. Although values and ranges are stated with precision, persons of skill in the art will recognize that in many cases, minor deviations from the precisely stated values are effective equivalents. A thickness P of the microporous body element 124a may be varied to control the flux of chalcogen passing through the microporous body element 124a.

The chalcogen source 190 may include a chalcogen material, for example, selenium (Se), sulfur (S), or a mixture thereof. The chalcogen source 190 may be in a solid state at room temperature, and when heated by the heating unit 130, the chalcogen source 190 may be changed into a liquid phase or a vapor phase. A thickness S of the chalcogen source 190 may be varied to change the flux of chalcogen into the object 180.

The window element 126 may be disposed above the microporous member 124, and may be supported by the third supporting element 124d of the microporous member 124. The window element 126 may consist of quartz, tempered glass, or sapphire. The window element 126 may be configured to deliver heat emitted from the heating unit 130 to the chalcogen source 190, and in addition, may prevent emission of the liquefied or vaporized chalcogen source 190 out of the layer formation unit 120.

The fixing element 128 may be disposed on the microporous member 124, and may allow the microporous member 124 to be fixed with the window element 126. In addition, the fixing element 128 may fix the microporous member 124 in position with respect to the object supporting element 122. The fixing element 128 may include silicon carbide-coated graphite.

In an embodiment, an inner chamber 127 is formed around the chalcogen source 190. In the embodiment shown in FIG. 2, the lower surface of the inner chamber 127 is defined by the microporous body element 124a, sidewalls of the inner chamber 127 are defined by third supporting elements 124d, and the upper surface of the inner chamber 127 is defined by window element 126. Remaining sidewalls of inner chamber 127 (not shown) may be defined, for example by additional supporting elements, sidewalls of the chamber 110. Surfaces of the inner chamber may contain a chalcogen gas evaporated from the chalcogen source 190. For example, the window element 126 may prevent the evaporated gas from being emitted into open spaces of the chamber 110 above the inner chamber 127.

The pressure in inner chamber 127 may be greater than a pressure below the microporous member 124, thereby creating a pressure differential that facilitates flow of liquid or vapor portions of the chalcogen source 190 to the object 180. In addition, the inner chamber 127 may prevent chalcogen gas evaporated from the chalcogen source 190 from flowing into open spaces of the chamber 110, so that the gas flows through the microporous member 124 to the object 180.

The heating unit 130 may be located outside the chamber 110, and may heat the chamber 110 and the layer formation unit 120. Accordingly, the heating unit 130 may heat the chalcogen source 190 to liquefy or vaporize the chalcogen source 190. The heating unit 130 may include at least one top heating unit 132 disposed above the chamber 110 and at least one bottom heating unit 134 disposed under the chamber 110, and to maintain heating temperature more uniformly, the heating unit 130 may further include at least one side heating unit 136 disposed on one or more sides of the chamber 110. The heating unit 130 may be a thermal line or an infrared light lamp.

When the heating unit 130 is an infrared light lamp, the chamber 110 may be rapidly heated or cooled, and accordingly, the object 180 may be rapidly heat treated. When the chamber 110 is formed of a transparent material, such as temperature glass or quartz, rapid thermal annealing may be easily performed. In an embodiment, to minimize a temperature distribution of the object 180, the number or power of the top heating units 132 may be different from the number or power of the bottom heating unit 134. For example, since heat generated by the top heating unit 132 needs to pass through the window element 126, the chalcogen source 190, and the microporous member 124 before it reaches the object 180, the number or power of top heating units 132 may be greater than the number or power of the bottom heating units 134. Accordingly, heating the chalcogen source 190 may include providing more heat to an upper portion of the chamber 110 than to a lower portion of the chamber 110. In another embodiment, the number and power of top heating units 132 may be the same as the number and power of bottom heating units 134.

A vacuum formation unit 140 may be connected to the chamber 110, and cause the chamber 110 may be evacuated. For example, the vacuum formation unit 140 may be a vacuum pump. The vacuum formation unit 140 is an optional element of the apparatus 100, and may be omitted in some embodiments.

A gas supplying unit 150 may be connected to the chamber 110, and configured to supply an inert gas, such as helium, argon, or nitrogen, to the evacuated chamber 110. The gas supplying unit 150 may supply the inert gas to the chamber 110 to make the pressure of the chamber 110 to a predetermined pressure, for example, about 1 atm. The gas supplying unit 150 is an optional element of the apparatus 100, and may be omitted.

Figure 3:
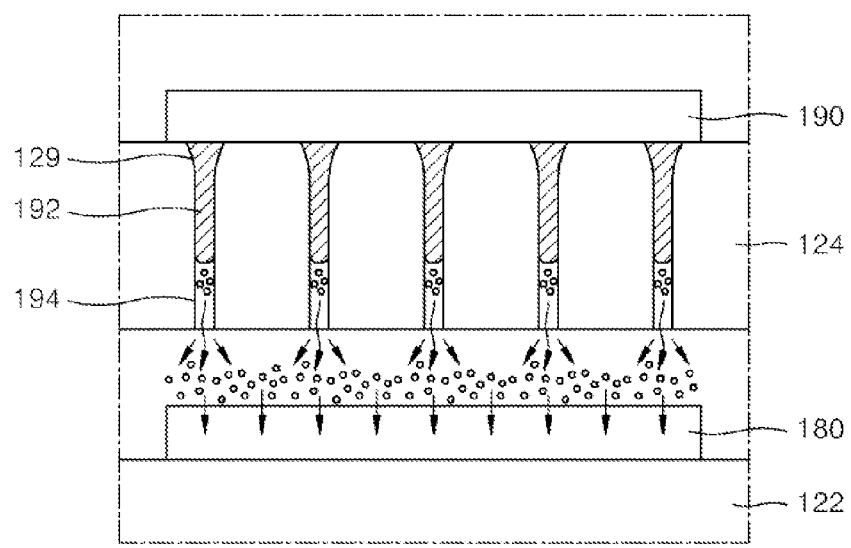
FIG. 3 is a schematic view illustrating aspects of a microporous member included in an apparatus for manufacturing a photovoltaic cell according to an embodiment of the present invention.

FIG. 3 is a schematic view illustrating a function of the microporous member 124 included in the apparatus 100 for manufacturing a photovoltaic cell according to an embodiment of the present invention.

Referring to FIG. 3, the microporous member 124 may include a plurality of micropores 129. As described above, the microporous member 124 may be formed of graphite, for example, graphite with a density of about 1.75 g/cm$^3$ to about 1.86 g/cm$^3$. According to another embodiment, the microporous member 124 may be formed of graphite with a porosity of about 6% to about 11%. However, the above stated density range and porosity range are only examples, and embodiments of the present invention are not limited thereto.

The size of micropores 129 may have a size such that a liquefied or vaporized chalcogen source passes through them. The size of the micropores 129 may vary, and, for example, may be in a range of a few nm to several tens μm. In addition, the size of the micropores 129 may be calculated from, for example, a porosity of about 6% to about 11%. The micropores 129 may be formed along a grain boundary of a material that forms the microporous member 124.

In the embodiment of FIG. 3, the micropores 129 are configured to prevent a chalcogen liquid 192 from passing through them, but they are large enough to allow a chalcogen gas 194 to pass. However, embodiments of the present invention are not limited thereto, and according to another embodiment, the chalcogen liquid 192 may pass through the micropores 129.

When the chalcogen source 190 is heated by the heating unit 130 illustrated in FIG. 2, the solid-phase chalcogen source 190 may be changed into the chalcogen liquid 192. For example, when the chalcogen source 190 is formed of selenium, the heating unit 130 may heat the chalcogen source 190 in a temperature range of 220° C., which is a melting point of selenium, and 685° C., which is a boiling point of selenium. The chalcogen liquid 192 may enter into the micropores 129 of the microporous member 124. However, in an embodiment, the micropores 129 may have a size such that the chalcogen liquid 192 does not pass and only the chalcogen gas 194 released from the chalcogen liquid 192 passes through the micropores 129. A radius of the micropores 129 may be calculated based on a porosity principle, for example, Equation 1.

$$R = -2\gamma LV \cos \theta / P \quad \text{[Equation 1]}$$

wherein R is a radius of micropores, γLV is a surface tension of a chalcogen liquid, θ is a contact angle of a chalcogen liquid, and P is a pressure. In an embodiment, pressure P is one atmosphere.

The chalcogen gas 194 that has passed through the micropores 129 may contact the object 180 to form a layer on the object 180 or diffuse into the object 180.

In an embodiment, the chalcogen source 190 is selenium. Selenium is inclined to form a multi-atomic gas, such as 2-atom gas $Se_2$, 4-atom gas $Se_4$, 6-atom gas $Se_6$, or 8-atom gas $Se_8$, instead of a monatomic gas. Thus, selenium gas has tends to have low reactivity and high molecular weight, and thus, may be difficult to actively diffuse. Accordingly, it is difficult to form a homogeneous layer, particularly for a large size photovoltaic cell, using conventional methods.

However, according to embodiments of the present invention, the microporous member 124 can be used to reduce formation of high molecular weights of the chalcogen gas, and accordingly, reactivity of the chalcogen gas may be increased. In addition, since a chalcogen material is supplied to the object 180 through the micropores 129 of the microporous member 124, the chalcogen material may be homogeneously supplied to the object 180. In addition, the spacing gap G (see FIG. 2) between the object 180 and the microporous member 124 may be controlled to homogeneously coat with selenium. In general, a narrower spacing gap G corresponds with a more homogenous coating. For example, the spacing gap G may be about 1 mm.

Figure 4:
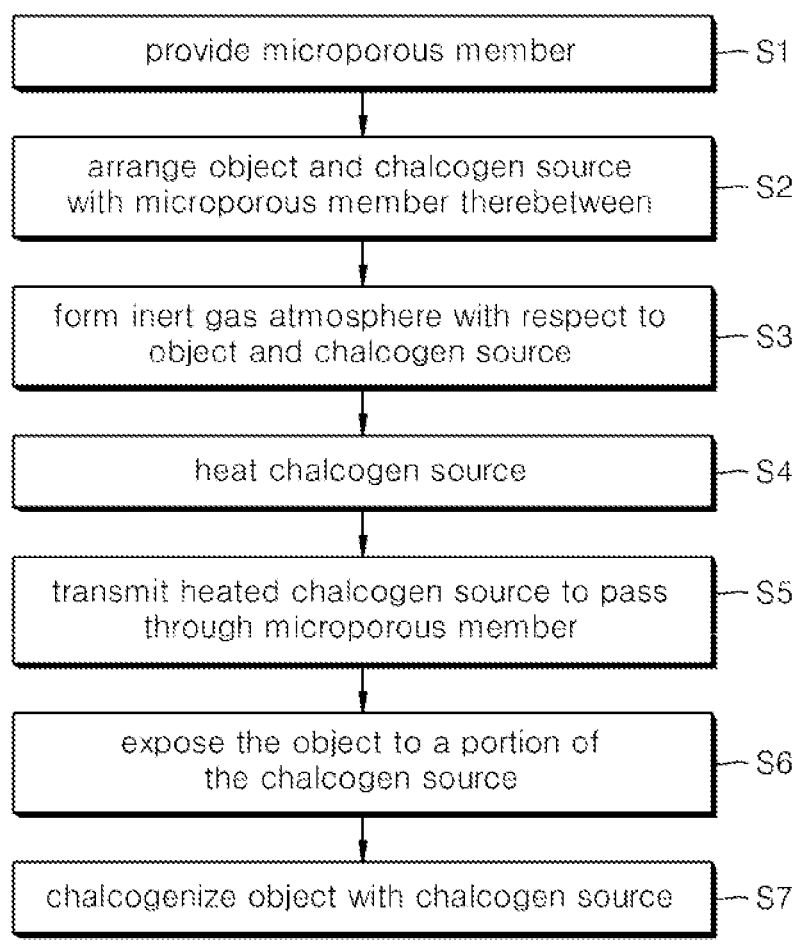
FIG. 4 is a flowchart illustrating a method of manufacturing the photovoltaic cell of FIG. 1 according to an embodiment of the present invention.

FIG. 4 is a flowchart illustrating a method of manufacturing the photovoltaic cell 1 of FIG. 1 according to an embodiment of the present invention.

Referring to FIG. 4, the method includes providing a microporous member (S1), arranging an object and a chalcogen source with the microporous member therebetween (S2), forming an inert gas atmosphere with respect to the object and the chalcogen source (S3), heating the chalcogen source (S4), transmitting the heated chalcogen source to pass through the microporous member (S5), exposing the object to the transmitted source (S6), and chalcognating the object with the chalcogen source and (S7). In more detail, step S5 of transmitting the heated chalcogen source includes transmitting a liquefied or evaporated portion of the heated chalcogen source through the microporous member, and step S6 includes exposing the object to the evaporated or liquefied portion.

In an embodiment, prior to the forming of an inert gas atmosphere with respect to the object and the chalcogen source (S3), the method may further include forming a vacuum atmosphere with respect to the object and the chalcogen source.

In addition, when the object 180 includes copper, indium, and gallium, and the chalcogen source 190 includes selenium, the chalcogen source may cause selenization of the object, thereby forming a copper-indium-gallium-selenium (CIGS) layer. In addition, when the object includes a CIGS layer and the chalcogen source includes sulfur, the chalcogen source may cause sulfuration of the object, thereby forming a copper-indium-gallium-selenium-sulfur (CIGSS) layer. In addition, according to another embodiment of the present invention, the chalcogen source may include a mixture of selenium and sulfur, and the object may be simultaneously selenized and sulfurated with the chalogen source. The object that has been subjected to the cahlognation, may also be used as the light absorption layer 30 of FIG. 1.

Figure 5:
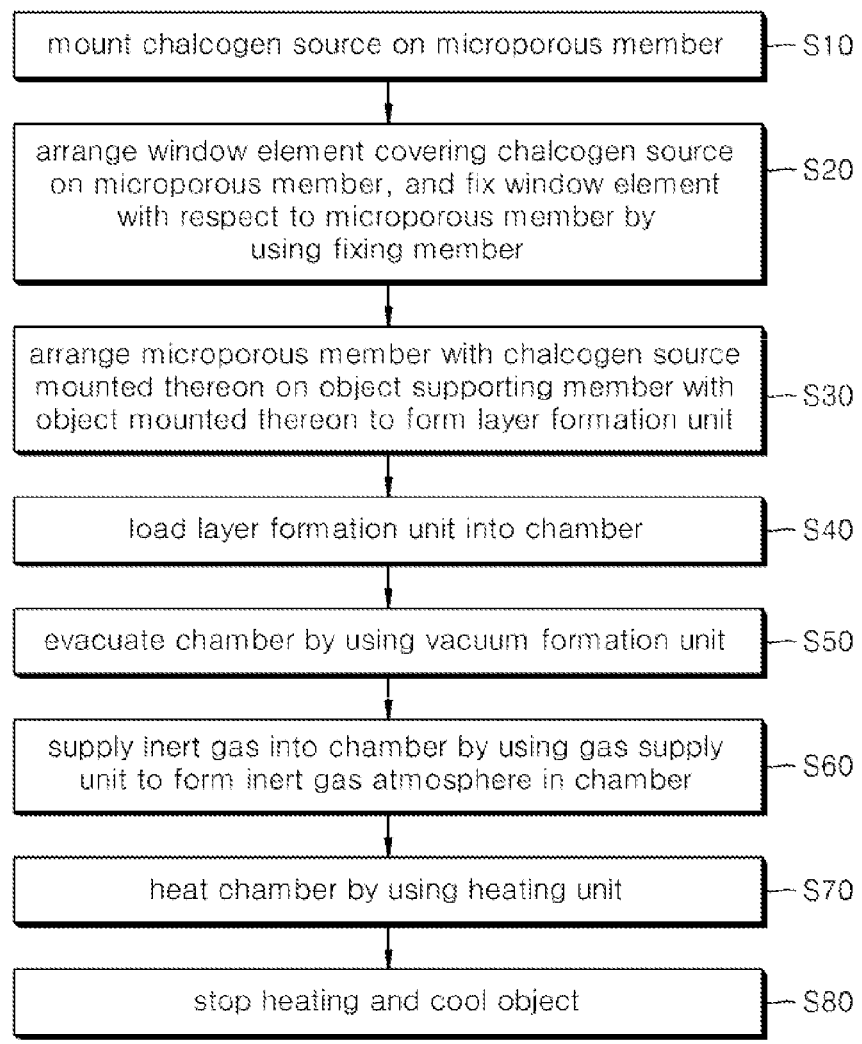
FIG. 5 is a flowchart illustrating a method of manufacturing the photovoltaic cell of FIG. 1 using the apparatus of FIG. 2 according to an embodiment of the present invention.

FIG. 5 is a flowchart illustrating a method of manufacturing the photovoltaic cell 1 of FIG. 1 by using the apparatus 100 of FIG. 2 according to an embodiment of the present invention. FIGS. 6-11 are cross-sectional views illustrating a method of manufacturing the photovoltaic cell 1 of FIG. 1 by using the apparatus 100 of FIG. 2 according to an embodiment of the present invention.

Figure 6:
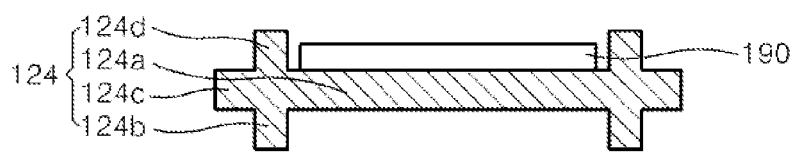
FIGS. 6-11 are cross-sectional views illustrating a method of manufacturing the photovoltaic cell of FIG. 1 using the apparatus of FIG. 2, according to an embodiment of the present invention.

Referring to FIGS. 5 and 6, the chalcogen source 190 is mounted on the microporous member 124 (S10). The chalcogen source 190 may include a chalcogen material, and may include, for example, selenium, sulfur, or a mixture thereof. The chalcogen source 190 may be a solid.

Figure 7:
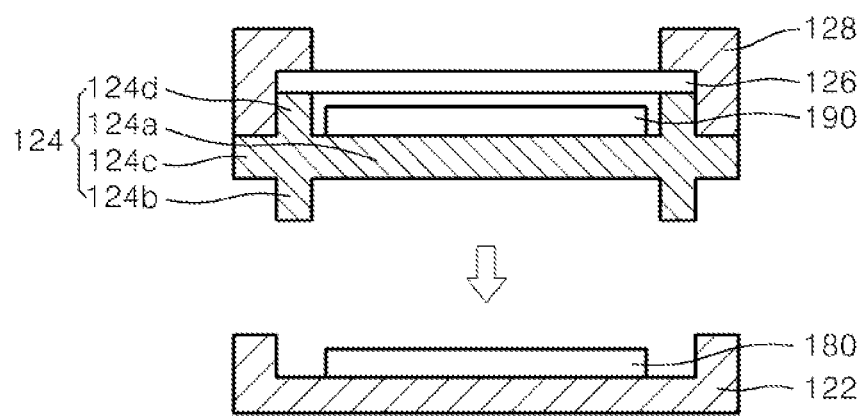

Referring to FIGS. 5 and 7, the window element 126 is disposed on the microporous member 124 to cover the chalcogen source 190, and the fixing element 128 may be used to fix the window element 126 with respect to the microporous member 124 (S20).

Figure 8:
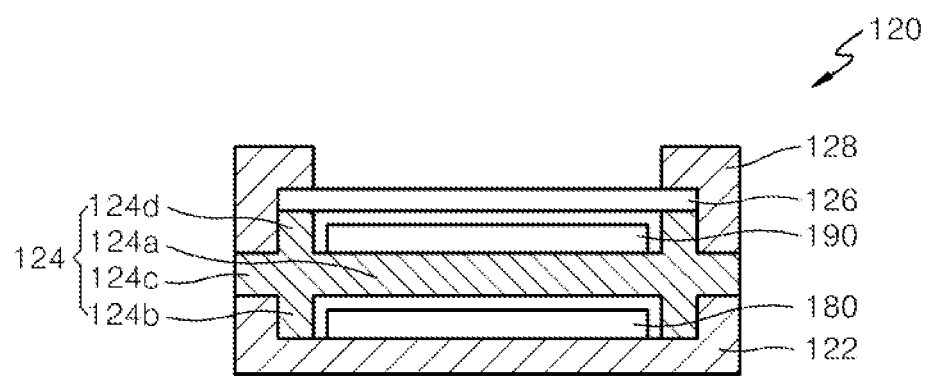

Referring to FIGS. 5 and 8, the microporous member 124 with chalcogen source 190 mounted thereon is disposed on the object supporting element 122 with the object 180 mounted thereon to form the layer formation unit 120 (S30). The object 180 may be a substrate. In an embodiment, the object 180 may have a structure comprising at least one layer including at least one selected from copper (Cu), indium (In), and gallium (Ga). For example, the object 180 may be a structure in which a multiple layers including a copper layer, an indium layer, and a gallium layer is formed on a substrate. The copper layer, the indium layer, and the gallium layer may each be formed in a separate process. The layers may be formed by sputtering. In addition, a stack sequence of the copper layer, the indium layer, and the gallium layer may differ in various embodiments.

According to another embodiment, the object 180 may be a structure in which a single copper-indium-gallium layer is disposed on a substrate. The copper-indium-gallium layer may be formed by simultaneously sputtering copper, indium, and gallium on a substrate.

The sequence of processes explained in connection with FIGS. 6 to 8 is an example only, and in various embodiments the processes may instead be performed in various other sequences.

Figure 9:
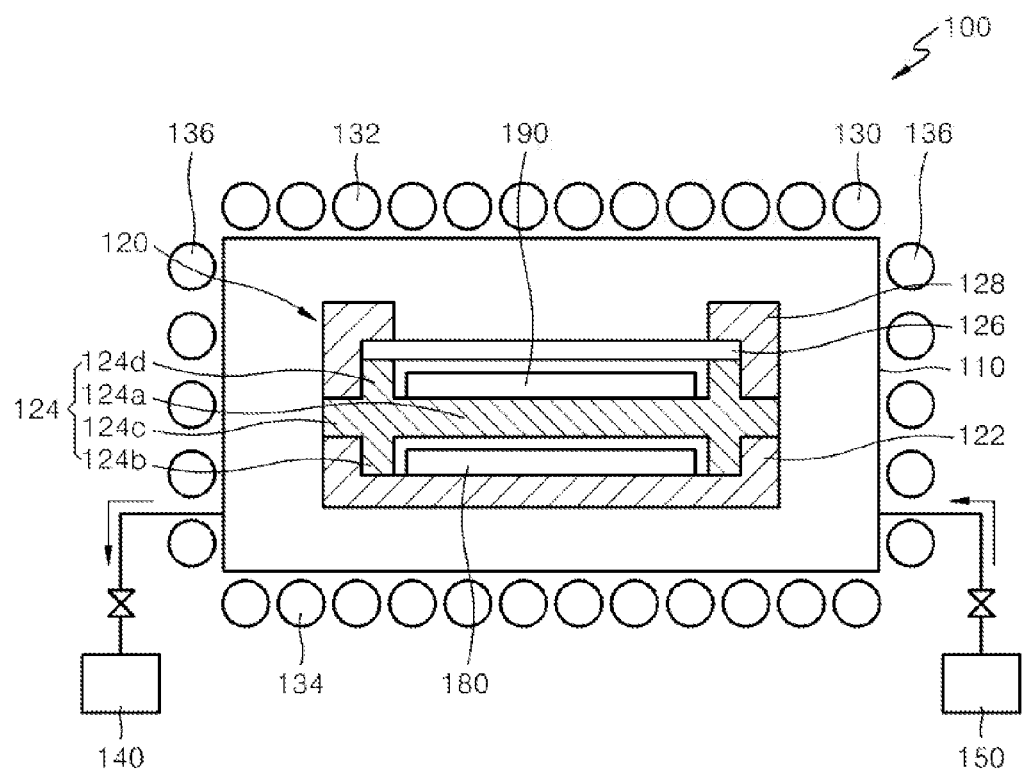

Referring to FIGS. 5 and 9, the layer formation unit 120 is loaded into the chamber 110 (S40). According to another embodiment, the layer formation unit 120 may be formed in the chamber 110. Subsequently, the chamber 110 is evacuated by the vacuum formation unit 140 (S50). The gas supplying unit 150 is used to supply an inert gas into the chamber 110 to create in inert gas atmosphere in the chamber 110 (S60).

According to an embodiment, the vacuum formation unit 140 is used to evacuate the chamber 110 and simultaneously, the gas supplying unit 150 is used to supply inert gas to the chamber 110. According to other embodiments, the chamber may be evacuated before and/or after forming an inert gas atmosphere. The pressure of the chamber 110 may vary, and for example, the inert gas may be controlled for the chamber 110 to have a pressure of about 1 atm.

Figure 10:
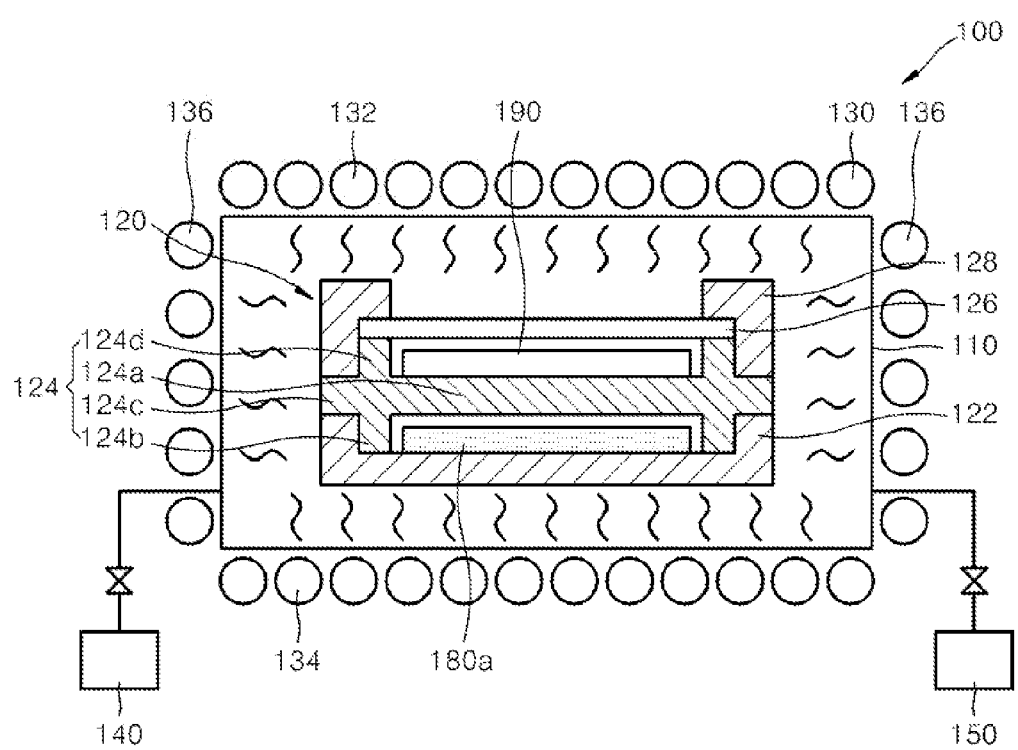

Referring to FIGS. 5 and 10, the heating unit 130 is used to heat the chamber 110 (S70). Due to the heating, the layer formation unit 120 may also be heated. In addition, the chalcogen source 190 in the layer formation unit 120 may be liquefied. In this regard, a temperature gradient of the layer formation unit 120 may be minimized. In addition, the object 180 may be heated such that a surface thereof has a homogeneous temperature. For example, the surface temperature may vary by no more than +/−10° C. The liquefied chalcogen source 190 may enter the micropores 129 of the microporous member 124 as described above with respect to FIG. 3.

Subsequently, the liquefied chalcogen material or vaporized chalcogen material may be coated on the surface of the object 180 through the micropores 129. Subsequently, the chalcogen material released from the chalcogen source 190 may form a chalcogen layer on the object 180. According to another embodiment, the chalcogen material released from the chalcogen source 190 may diffuse into the object 180 to induce chalcogenation of a material included in the object 180, thereby forming a chalcogenated object 180a.

The heating operation (S70) may be performed at a temperature of, for example, about 220° C. to about 680° C. In addition, the heating operation (S70) may be performed for a set time, for example, 1 sec to 60 min. In an embodiment, when the chalcogen source 190 is selenium, the heating operation (S70) may be performed at the temperature of about 400° C. to about 500° C. for 1 min to 20 min. For example, heating may be performed at the temperature of about 460° C. for about 10 min. In an embodiment in which the chalcogen source 190 is sulfur (S), the heating operation (S70) may be performed at the temperature of about 500° C. to about 600° C. for 10 sec to 10 min. For example, heating of sulfur may be performed at the temperature of about 530° C. for about 1 min.

Due to the heating operation (S70), layers included in the object 180 may be heat treated. For example, when the object 180 includes a multi-layer including a copper layer, an indium layer, and a gallium layer, the layers may diffuse into each other to form a single layer. In addition, when the chalcogen source 190 is selenium, the object 180 may undergo selenization, thereby forming the chalcogenated object 180a. In an embodiment, the selenizated object 180a is a CIGS layer. In an embodiment where the chalcogen source 190 is sulfur, the object 180 may undergo sulfuration, thereby forming the chalcogenated object 180a, which may include a CIGSS layer.

Figure 11:
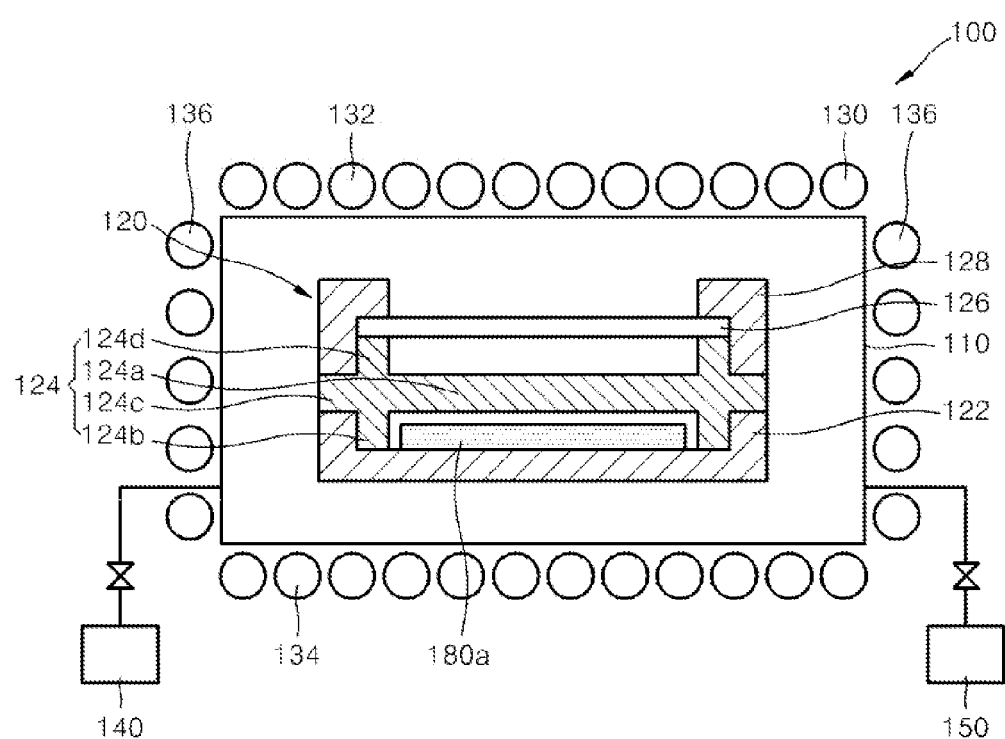

Referring to FIGS. 5 and 11, when the chalcogen source 190 is completely depleted, or when the object 180 is transformed into the chalcogenated object 180a due to chalcogenation, the heating unit 130 may stop the heating and the object 180a is cooled (S80). To minimize thermal impact on the object 180a, the object 180a may be cooled in the chamber 110, and in some embodiments, the operation of the heating unit 130 may be controlled such that heat supplied to the object 180a from the heating unit 130 is gradually reduced.

The chalcogenated object 180a may include a CIGS layer or a CIGSS layer. In an embodiment, the chalcogenated object 180a may be used as the light absorption layer 30 illustrated in FIG. 1.

The operations explained in connection with FIGS. 6 to 11 may be performed as a repeating cycle. For example, in a first cycle, selenium is used as the chalcogen source 190 to perform the operations to selenize the object 180. Subsequently, in a second cycle, sulfur is used as the chalcogen source 190 to perform the operations to sulfurate the object 180. According to another embodiment, the chalcogen source 190 is the same material in both of the first and second cycles.

FIGS. 12 to 15 illustrate examples of the microporous member 124 included in the apparatus 100 for manufacturing a photovoltaic cell according to embodiments of the present invention.

Figure 12:
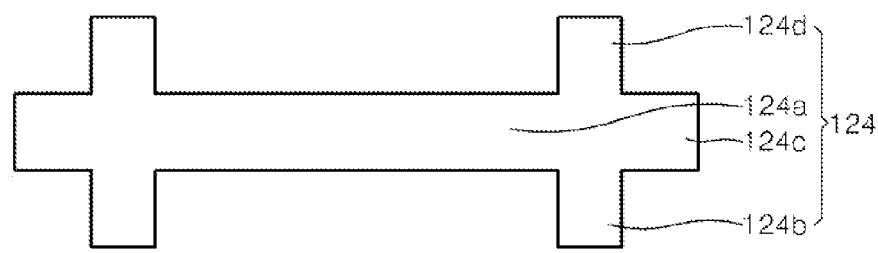
FIGS. 12 to 15 illustrate examples of a microporous member included in an apparatus for manufacturing a photovoltaic cell according to an embodiment of the present invention.

Referring to FIG. 12, the microporous member 124 may include the microporous body element 124a, the first supporting element 124b, the second supporting element 124c, and the third supporting element 124d. The microporous body element 124a may include micropores through which vaporized or liquid chalcogen material flows from the chalcogen source 190. Embodiments of suitable micropores are described above in connection with FIG. 3. The first supporting element 124b, the second supporting element 124c, and the third supporting element 124d may perform the same supporting functions as described in connection with FIG. 2. In an embodiment, the microporous member 124 is symmetrical about at least two axes, such as the X (horizontal) and Y (vertical) axes of FIG. 12.

In the embodiment shown in FIG. 12, the microporous body element 124a, the first supporting element 124b, the second supporting element 124c, and the third supporting element 124d are formed as a unified continuous single body structure, constituting the microporous member 124. In an embodiment, the microporous body element 124a, the first supporting element 124b, the second supporting element 124c, and the third supporting element 124d may all be formed of an identical material, for example, a micropore-containing graphite. In addition, the first supporting element 124b, the second supporting element 124c, and the third supporting element 124d may be coated with, for example, silicon carbide, and the microporous body element 124a may not be coated with the silicon carbide.

Figure 13:
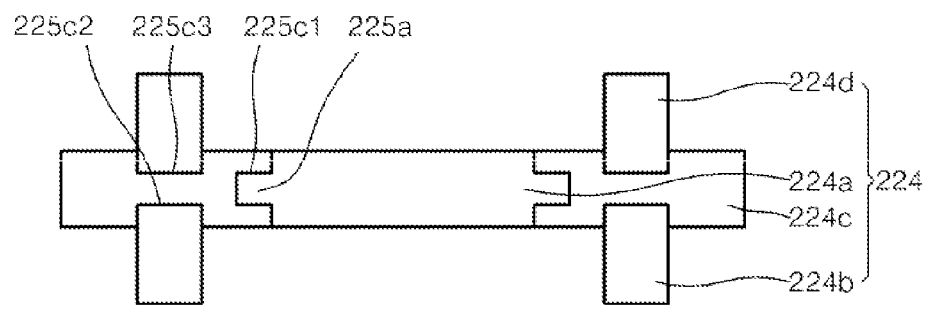

Referring to FIG. 13, a microporous member 224 may include a microporous body element 224a, a first supporting element 224b, a second supporting element 224c, and a third supporting element 224d. The microporous body element 224a may include micropores through which vaporized chalcogen material flows from the chalcogen source 190. The microporous body element 224a, the first supporting element 224b, the second supporting element 224c, and the third supporting element 224d may each be formed as separate structures, and then assembled together to form the microporous member 224.

For example, the microporous body element 224a may have a protrusion 225a, and the second supporting element 224c may have a first groove 225c1 into which the protrusion 225a is inserted such that the first groove 225c1 is coupled to the protrusion 225a. According to another embodiment, the second supporting element 224c may include the protrusion 225a and the microporous body element 224a may include the first groove 225c1. In addition, the second supporting element 224c may have a second groove 225c2 in a lower portion thereof. The first supporting element 224b may be inserted into the second groove 225c2 such that the first supporting element 224b is coupled with the second groove 225c2.

The second supporting element 224c may have a third groove 225c3 in an upper portion thereof. The third supporting element 224d may be inserted into the third groove 225c3 such that the third supporting element 224d is coupled with the third groove 225c3. The microporous body element 224a may include graphite having micropores, and the first supporting element 224b, the second supporting element 224c, and the third supporting element 224d may include silicon carbide-coated graphite. Although the elements shown in FIG. 13 have simple rectangular slot and groove interfaces, embodiments of the present invention are not limited thereto. For example, another embodiment may include trapezoidal dovetail interlocking mechanisms.

Figure 14:
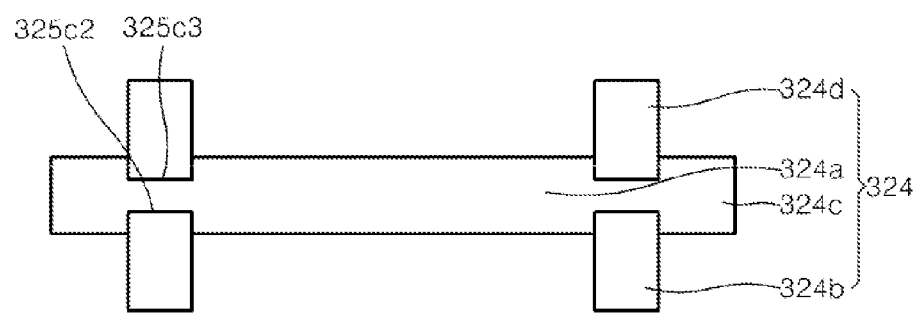

Referring to FIG. 14, in an embodiment, a microporous member 324 may include a microporous body element 324a, a first supporting element 324b, a second supporting element 324c, and a third supporting element 324d. The microporous body element 324a and the second supporting element 324c may be formed as a single, continuous structure. The microporous body element 324a, the first supporting element 324b, and the third supporting element 324d may each be formed as a separate structures, and then assembled together to form the microporous member 324.

For example, the second supporting element 324c may have a second groove 325c2 in a lower portion thereof. The first supporting element 324b may be inserted into the second groove 325c2 such that the first supporting element 324b is coupled with the second groove 325c2. The second supporting element 324c may have a third groove 325c3 in an upper portion thereof. The third supporting element 324d may be inserted into the third groove 325c3 such that the third supporting element 324d is coupled with the third groove 325c3. The microporous body element 324a and the second supporting element 324c may include graphite having micropores, and the first supporting element 324b and the third supporting element 324d may include silicon carbide-coated graphite. In various embodiments, the protrusions and grooves of the elements may have various shapes.

Figure 15:
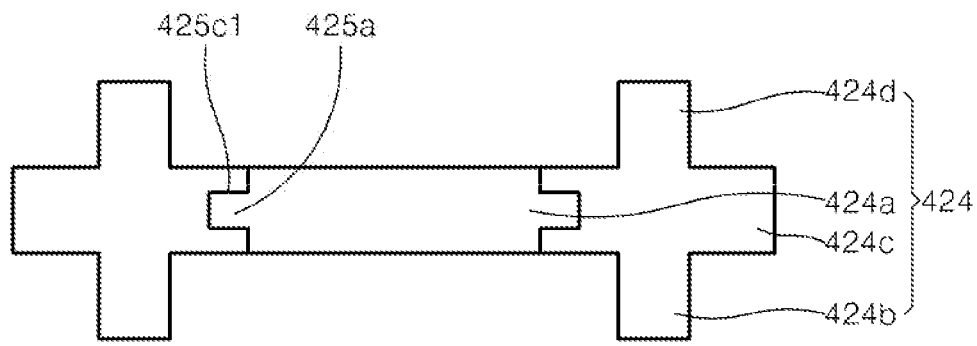

Referring to FIG. 15, in an embodiment, a microporous member 424 may include a microporous body element 424a, a first supporting element 424b, a second supporting element 424c, and a third supporting element 424d. The first supporting element 424b, the second supporting element 424c, and the third supporting element 424d may be formed as a continuous monolithic single body structure. The microporous body element 424a and the monolithic single body structure may each be formed as separate structures, and then assembled together to form the microporous member 424.

For example, the microporous body element 424a may have a protrusion 425a, and the second supporting element 424c may have a first groove 425c1 into which the protrusion 425a is inserted such that the first groove 425c1 is coupled with the protrusion 425a. According to another embodiment, the second supporting element 424c may include the protrusion 425a and the microporous body element 424a may include the first groove 425c1. The microporous body element 424a and the second supporting element 424c may include graphite having micropores, and the first supporting element 424b and the third supporting element 424d may include silicon carbide-coated graphite. In various embodiments, the protrusions and grooves may have various shapes.

Figure 16:
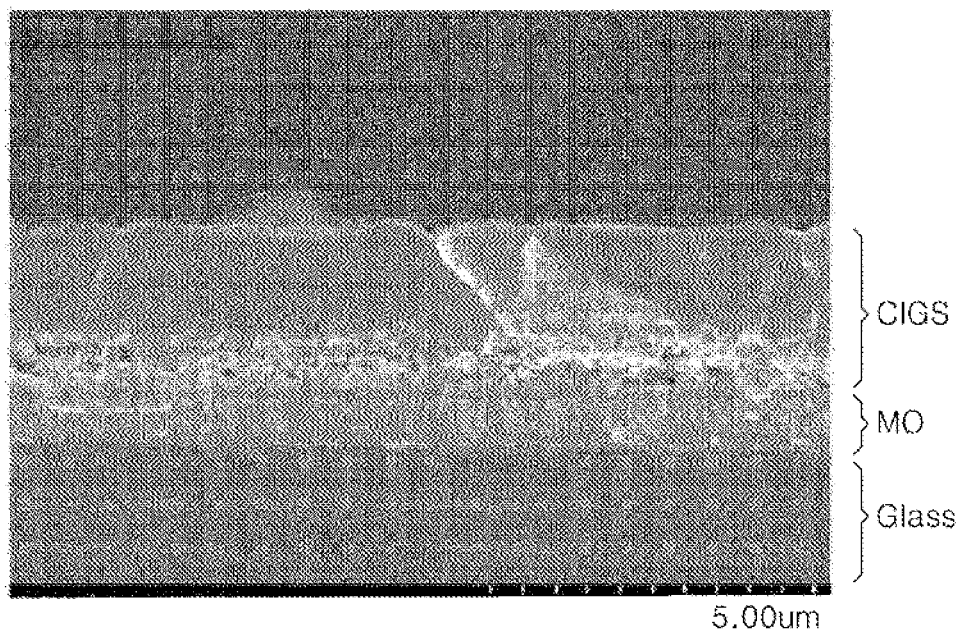
FIG. 16 shows a scanning electron microscope image of a cross-section of a copper-indium-gallium-selenium (CIGS) layer formed using a method of manufacturing a photovoltaic cell according to an embodiment of the present invention.
Figure 17:
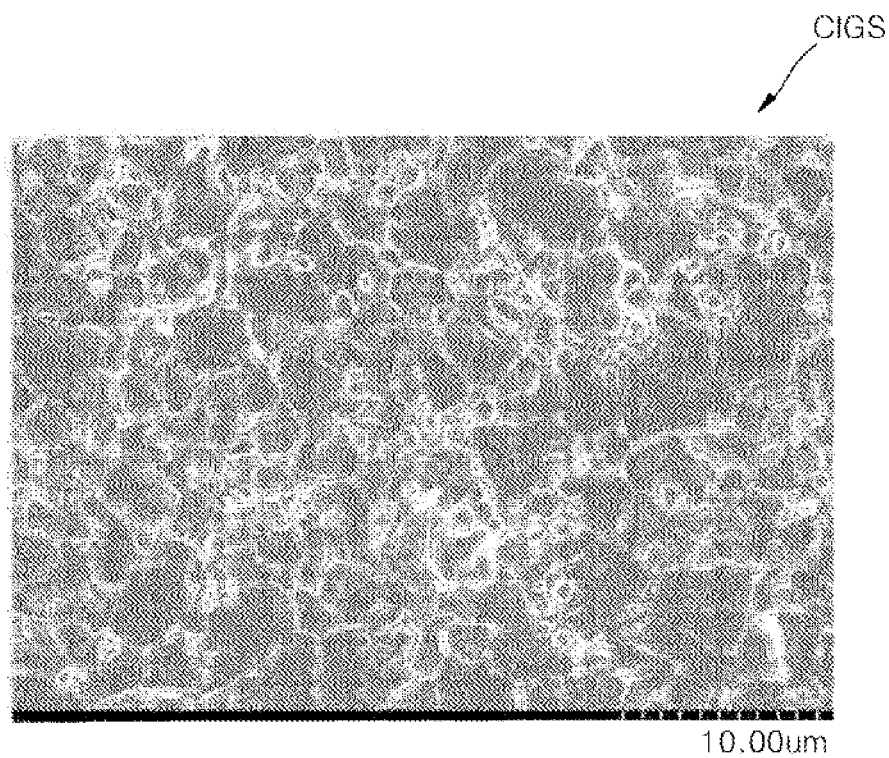
FIG. 17 shows a scanning electron microscope image of a top surface of a CIGS layer formed using a method of manufacturing a photovoltaic cell according to an embodiment of the present invention.

FIG. 16 shows a scanning electron microscope image of a cross-section of a copper-indium-gallium-selenium (CIGS) layer formed by using a method of manufacturing a photovoltaic cell according to an embodiment of the present invention. FIG. 17 shows a scanning electron microscope image of a top surface of a CIGS layer formed by a method of manufacturing a photovoltaic cell according to an embodiment of the present invention.

Referring to FIGS. 16 and 17, in an embodiment, a molybdenum (Mo) layer is formed on a glass substrate, and a CIGS layer is formed on the molybdenum layer. The CIGS layer may formed by performing a heat treatment at a temperature of about 460° C. for 20 minutes.

When a CIGS layer is formed by using a conventional method, the CIGS layer may have poor characteristics. For example, a surface thereof may be very rough and may include micrograins, and an interface between the CIGS layer and the molybdenum (Mo) layer may have substantial voids.

In contrast, a CIGS layer formed according to an embodiment of the present invention may have a flat surface, almost no voids at the interface between the CIGS layer and the molybdenum (Mo) layer, and the CIGS layer may have relatively large grains. Such structural characteristics homogeneously occur in a CIGS layer formed according to embodiments of the present invention.

The flat and homogeneous CIGS layer may lead to an improvement of contact properties thereof with a subsequently formed buffer layer 40 or an upper electrode 50, thereby improving layer coating characteristics and reducing contact resistance. In addition, since the flat and homogeneous CIGS layer may prevent or minimize emission of incident solar light from inside a photovoltaic cell, efficiency of the photovoltaic cell may increase.

In an apparatus and method for manufacturing a photovoltaic cell according to embodiments of the present invention, a chalcogen material is supplied to an object that is to undergo chalcogenation through a microporous body. Accordingly, since the chalcogen source can be used in an optimal amount in performing chalcogenation, the amount of the chalcogen material consumed may be minimized. In other words, embodiments of the present invention provide a more efficient chalcogenation process.

Additional advantages that may be provided by embodiments of the present invention include reducing concerns associated with corrosion. Since a toxic and corrosive material, such as $H_2Se$ or $H_2S$, is not used as a chalcogen source, stability and protection for an apparatus may be maximized. In addition, since the chalcogen material is directly supplied to the object through the microporous body, contamination of the chamber may be minimized, and a use time of an apparatus may be maximized, while maintenance costs for an apparatus may also be minimized.

Such effects are merely examples, and do not limit the scope of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A method of manufacturing a photovoltaic cell, the method comprising:
   providing a microporous member having micropores;
   arranging an object on a first side of the microporous member;
   arranging a chalcogen source on a second side of the microporous member opposite to the first side;
   heating the chalcogen source to liquefy the chalcogen source;
   providing the chalcogen source that has been liquefied to the micropores;
   retaining the liquefied chalcogen source at an upper portion of the microporous member to evaporate a portion of the liquefied chalcogen source and obtain a chalcogen gas; and
   exposing the object to the chalcogen gas exiting from a lower portion of the microporous member, the chalcogen gas having traveled through the micropores,
   wherein the micropores are large enough to allow the chalcogen gas to flow through the micropores but small enough to prevent the liquefied chalcogen source from flowing through the micropores.
2. The method of claim 1, wherein the step of exposing the object to chalcogen gas includes chalcogenizing the object.
3. The method of claim 1, wherein the chalcogen source comprises selenium, sulfur, or a mixture thereof.

4. The method of claim 1, wherein the chalcogen source comprises a mixture of selenium and sulfur, and exposing the object to the chalcogen gas includes simultaneously selenizing and sulfurating the object.

5. The method of claim 1, further comprising:
forming an inert gas atmosphere with respect to the object and the chalcogen source before heating the chalcogen source.

6. The method of claim 5, further comprising:
forming a vacuum atmosphere with respect to the object and the chalcogen source before forming the inert gas atmosphere.

7. The method of claim 1, wherein the heating is performed at a temperature of about 220° C. to about 680° C.

8. The method of claim 1, wherein the object comprises at least one of copper, indium, and gallium.

9. The method of claim 1, wherein heating the chalcogen source includes providing more heat to an upper portion of a chamber enclosing the object and the chalcogen source than to a lower portion of the chamber.

10. The method of claim 1, wherein the chalcogen gas travels through the micropores in a downward direction.

11. The method of claim 1, further comprising:
applying a pressure differential between a top surface of the microporous member and a bottom surface of the microporous member such that a pressure at the top surface is greater than a pressure at the bottom surface.

12. The method of claim 1, wherein the object is arranged such that a distance between an upper portion of the object and a bottom surface of the microporous member is between about 0.5 and about 1.0 mm.

13. A method of manufacturing a photovoltaic cell, the method comprising:
providing a microporous member having micropores;
arranging an object on a first side of the microporous member;
arranging a chalcogen source on a second side of the microporous member opposite to the first side;
heating the chalcogen source to liquefy the chalcogen source;
providing the chalcogen source that has been liquefied to the micropores;
retaining the liquefied chalcogen source at an upper portion of the microporous member to evaporate a portion of the liquefied chalcogen source and obtain a chalcogen gas; and
exposing the object to the chalcogen gas exiting from a lower portion of the microporous member, the chalcogen gas having traveled through the micropores,
wherein the object is arranged such that a distance between an upper portion of the object and a bottom surface of the microporous member is between about 0.5 and about 1.0 mm.

* * * * *